(12) United States Patent
Nagai et al.

(10) Patent No.: US 8,026,039 B2
(45) Date of Patent: Sep. 27, 2011

(54) RADIATION-SENSITIVE RESIN COMPOSITION

(75) Inventors: Tomoki Nagai, Tokyo (JP); Takuma Ebata, Tokyo (JP); Makoto Shimizu, Tokyo (JP)

(73) Assignee: JSR Corporation, Tokyo (JP)

( * ) Notice: Subject to any disclaimer, the term of this patent is extended or adjusted under 35 U.S.C. 154(b) by 315 days.

(21) Appl. No.: 12/514,212

(22) PCT Filed: Nov. 9, 2007

(86) PCT No.: PCT/JP2007/071850
§ 371 (c)(1),
(2), (4) Date: May 8, 2009

(87) PCT Pub. No.: WO2008/056796
PCT Pub. Date: May 15, 2008

(65) Prior Publication Data
US 2010/0040977 A1    Feb. 18, 2010

(30) Foreign Application Priority Data

Nov. 10, 2006   (JP) .................................. 2006-305843

(51) Int. Cl.
G03F 7/004    (2006.01)
(52) U.S. Cl. ..................... 430/270.1; 430/907; 430/910
(58) Field of Classification Search ............... 430/270.1, 430/907, 910
See application file for complete search history.

(56) References Cited

U.S. PATENT DOCUMENTS

| | | | |
|---|---|---|---|
| 4,491,628 A | 1/1985 | Ito et al. | |
| 5,945,250 A | 8/1999 | Aoai et al. | |
| 2002/0068241 A1 | 6/2002 | Oohashi et al. | |
| 2004/0086799 A1 | 5/2004 | Oohashi et al. | |
| 2007/0149702 A1 | 6/2007 | Ando et al. | |
| 2007/0231708 A1 | 10/2007 | Matsumaru et al. | |
| 2010/0063232 A1* | 3/2010 | Nagai et al. | 526/287 |

FOREIGN PATENT DOCUMENTS

| | | |
|---|---|---|
| JP | 2-27660 B | 3/1984 |
| JP | 9-325497 A | 12/1997 |
| JP | 2002-107929 A | 4/2002 |
| JP | 2005-84365 A | 3/2005 |
| JP | 2006-45311 A | 2/2006 |
| JP | 2006-178317 A | 7/2006 |
| JP | 2007-197718 A | 8/2007 |

OTHER PUBLICATIONS

Michael D. Stewart et al., "Organic imaging materials: a view of the future", Journal of Physical Organic Chemistry, pp. 767-774, vol. 13, XP-002607090, Aug. 22, 2000.
Extended European Search Report for corresponding EP Application No. 07831581.9-1226, Nov. 11, 2010.
Federal Register Oct. 18, 2000 (vol. 65, No. 202), "Perfluorooctyl Sulfonates; Proposed Significant New Use Rule".
Nakamura et al., "Resist Surface Roughness Calculated using Theoretical Percolation Model", Journal of Photopolymer Science and Technology, vol. 11, No. 4, 1998, pp. 571-576.
Shiobara et al., "Resist Edge Roughness with Reducing Pattern Size", SPIE vol. 3333, pp. 313-323, (1998).
Palmateer et al., "Line Edge Roughness in sub-0.18-μm Resist Patterns", SPIE vol. 3333, pp. 634-642, (1998).
Namatsu et al., "Three-dimensional siloxane resist for the formation of nanopatterns with minimum linewidth fluctuations", J. Vac. Sci. Technol. B, vol. 16, No. 1, Jan./Feb. 1998, pp. 69-76.
Cowie et al., "Novel single ion, comb-branched polymer electrolytes", Solid State Ionics 123 (1999) pp. 233-242.

* cited by examiner

*Primary Examiner* — John S Chu
(74) *Attorney, Agent, or Firm* — Ditthavong Mori & Steiner, P.C.

(57) ABSTRACT

A radiation-sensitive resin composition includes a resin that includes a repeating unit shown by the following formula (1) and a solvent. The radiation-sensitive resin composition has an excellent performance as a radiation-sensitive acid generator, includes a resin that adversely affects the environment and a human body to only a small extent, and can form a resist film that has a high resolution and forms an excellent resist pattern.

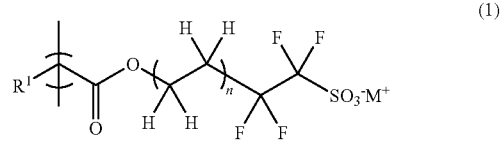

(1)

wherein $R^1$ represents a hydrogen atom or the like, $M^+$ represents a specific cation, and n represents an integer from 1 to 5.

1 Claim, No Drawings

RADIATION-SENSITIVE RESIN COMPOSITION

TECHNICAL FIELD

The present invention relates to a radiation-sensitive resin composition that contains a resin and a solvent, the resin including a repeating unit derived from a polymerizable onium sulfonate having a specific structure.

BACKGROUND ART

In the production of integrated circuit devices, a lithographic process utilizing near ultraviolet radiation (e.g., I-line) has been generally performed. However, it is considered to be very difficult to implement sub-quarter-micron microfabrication using near ultraviolet radiation. Specifically, it is difficult to achieve a higher degree of integration utilizing near ultraviolet radiation. Therefore, a lithographic process that can implement microfabrication with a line width of 0.20 μm or less has been desired in order to achieve a higher degree of integration.

As a means that enables such microfabrication, a lithographic process utilizing radiation having a wavelength shorter than that of near ultraviolet radiation has been studied. Examples of radiation having such a short wavelength include deep ultraviolet radiation (e.g., a bright-line spectrum of a mercury lamp and radiation emitted from an excimer laser), X-rays, electron beams, and the like. Among these, radiation emitted from a KrF excimer laser (wavelength: 248 nm), an ArF excimer laser (wavelength: 193 nm), or an $F_2$ excimer laser (wavelength: 157 nm), EUV radiation (e.g., wavelength: 13 nm), electron beams, and the like have attracted attention.

Along with the use of short-wavelength radiation, a number of radiation-sensitive resin compositions suitable for use with short-wavelength radiation have been proposed. For example, a composition that utilizes a chemical amplification effect due to a component having an acid-dissociable functional group and a radiation-sensitive acid generator (hereinafter may be referred to as "chemically-amplified radiation-sensitive composition"); said composition generating an acid upon exposure to radiation (hereinafter may be referred to as "exposure") has been proposed.

Specifically, a composition that contains a polymer having a t-butyl ester group of a carboxylic acid or a t-butyl carbonate group of phenol and a radiation-sensitive acid generator has been proposed (see Patent Document 1). According to this composition, the t-butyl ester group or the t-butyl carbonate group contained in the polymer dissociates due to the action of an acid generated upon exposure and forms an acidic group that is a carboxyl group or a phenolic hydroxyl group. Therefore, the exposed area of the resist film formed of the composition is easily dissolved in an alkaline developer. Accordingly, a desired resist pattern can be formed on the resist film by developing the resist film using an alkaline developer.

The radiation-sensitive acid generator contained in the chemically-amplified radiation-sensitive composition must have a high radiation transmittance and a high quantum yield when generating an acid. The acid generated by the radiation-sensitive acid generator must have sufficiently high acidity, a sufficiently high boiling point, and an appropriate diffusion length in the resist film, for example.

In order to ensure that the acid has high acidity, a sufficiently high boiling point, and an appropriate diffusion length, the structure of an anion moiety is important when using an ionic radiation-sensitive acid generator. Moreover, when a nonionic radiation-sensitive acid generator having a sulfonyl structure or a sulfonate structure is used, the structure of the sulfonyl moiety is important.

For example, a radiation-sensitive acid generator having a trifluoromethanesulfonyl structure generates an acid having sufficiently high acidity so that the photoresist exhibits a sufficiently high resolution. However, such a radiation-sensitive acid generator has a drawback in that the photoresist shows high mask dependence since the acid generated by the radiation-sensitive acid generator has a low boiling point and an inadequate diffusion length; i.e., a large diffusion length of the acid. Further, a radiation-sensitive acid generator having a sulfonyl structure (e.g., 10-camphorsulfonyl structure) bonded to a large organic group since the acid generated by the radiation-sensitive acid generator has a sufficiently high boiling point and an adequate diffusion length. That is, it shows reduced mask dependence due to a sufficiently short diffusion length. However, the photoresist exhibits an insufficient resolution since the acid has insufficient acidity.

Here, a radiation-sensitive acid generator having a perfluoroalkylsulfonyl structure (e.g., perfluoro-n-octanesulfonate (PFOS)) has attracted attention in recent years due to the capability of generating an acid having sufficiently high acidity, a sufficiently high boiling point, and an appropriate diffusion length.

However, since a radiation-sensitive acid generator having a perfluoroalkylsulfonyl structure (e.g., PFOS) is considered to cause environmental problems due to low combustibility and potential problem associated with its accumulation in human body, it is not free from a problem that the U.S. Environmental Protection Agency has proposed a rule regulating the use of these compounds (see Non-patent Document 1).

On the other hand, since it becomes necessary to more accurately control the line width, for example, if the design device dimensions are sub-half-micron or less, it is important for the chemically-amplified resist to have a high resolution and form a resist pattern having excellent surface smoothness. When a chemically-amplified resist cannot form a resist pattern having excellent surface smoothness, elevations or depressions (hereinafter may be referred to as "nano-edge roughness") on the surface of the film are transferred to the substrate when transferring the resist pattern by etching or the like. As a result, the dimensional accuracy of the pattern deteriorates. Therefore, it has been reported that the electrical properties of the resulting device may be impaired (see Non-patent Documents 2 to 5, for example).

Patent Document 1: JP-B-2-27660
Non-patent Document 1: Perfluorooctyl Sulfonates; Proposed Significant New Use Rule
Non-patent Document 2: J. Photopolym. Sci. Tech., p. 571 (1998)
Non-patent Document 3: Proc. SPIE, Vol. 3333, p. 313
Non-patent Document 4: Proc. SPIE, Vol. 3333, p. 634
Non-patent Document 5: J. Vac. Sci. Technol. B16 (1), p. 69 (1998)

DISCLOSURE OF THE INVENTION

Accordingly, development of a radiation-sensitive resin composition that is free from the drawbacks of a radiation-sensitive acid generator having a perfluoroalkylsulfonyl structure (e.g., PFOS), exhibits a high resolution, and can form a chemically-amplified resist that reduces nano-edge roughness becomes an urgent task.

An object of the present invention is to provide a radiation-sensitive resin composition that generates an acid that does not volatilize and has an appropriately small diffusion length upon exposure to radiation, shows small mask pattern dependence, and can form a resist film that can produce a resist pattern having excellent surface/sidewall smoothness.

The present inventors conducted extensive studies in order to achieve the above object. As a result, the inventors found that the above object can be achieved by a radiation-sensitive resin composition that includes a resin having a repeating unit derived from a polymerizable onium sulfonate having a specific structure and a solvent. This finding has led to the completion of the present invention.

According to the present invention, the following radiation-sensitive resin composition is provided.

[1] A radiation-sensitive resin composition comprising a resin and a solvent, the resin including a repeating unit shown by the following general formula (1),

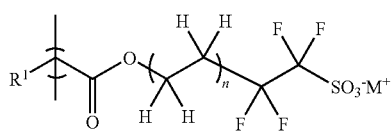

(1)

wherein $R^1$ represents a hydrogen atom, a fluorine atom, or an alkyl group having 1 to 3 carbon atoms, provided that some or all of the hydrogen atoms of the alkyl group may be replaced by a fluorine atom, $M^+$ represents a sulfonium cation shown by the following general formula (2) or an iodonium cation shown by the following general formula (3), and n represents an integer from 1 to 5,

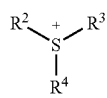

(2)

wherein $R^2$, $R^3$, and $R^4$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, an unsubstituted monovalent heterocyclic organic group having 4 to 30 atoms, or a substituent having a ring wherein two or more of $R^2$, $R^3$, and $R^4$ in the formula (2) are bonded via the sulfur atom,

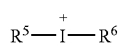

(3)

wherein $R^5$ and $R^6$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, an unsubstituted monovalent heterocyclic organic group having 4 to 30 atoms, or a substituent having a ring wherein $R^5$ and $R^6$ in the formula (3) are bonded via the iodine atom.

The radiation-sensitive resin composition according to the present invention generates an acid that does not volatilize and has an appropriately small diffusion length upon exposure to radiation, shows small mask pattern dependence, and can form a resist film that can produce a resist pattern having excellent surface/sidewall smoothness.

BEST MODE FOR CARRYING OUT THE INVENTION

Preferred embodiments of the present invention are described below. Note that the present invention is not limited to the following embodiments. It should be interpreted that the present invention covers also various modifications and improvements, which may be made of the embodiments without departing from the scope of the present invention based on the knowledge of a person skilled in the art.

[1] Radiation-sensitive Resin Composition

A radiation-sensitive resin composition according to one embodiment of the present invention includes a resin and a solvent, the resin including a repeating unit shown by the following general formula (1). This radiation-sensitive resin composition has an excellent function as a radiation-sensitive acid generator, includes a resin giving less impact on the environment and a human body as well, and can form a resist film that can produce an excellent resist pattern.

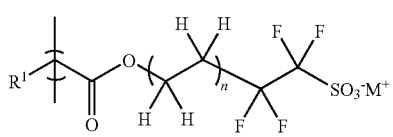

(1)

wherein $R^1$ represents a hydrogen atom, a fluorine atom, or an alkyl group having 1 to 3 carbon atoms, provided that some or all of the hydrogen atoms of the alkyl group may be replaced by a fluorine atom, $M^+$ represents a sulfonium cation shown by the following general formula (2) or an iodonium cation shown by the following general formula (3), and n represents an integer from 1 to 5,

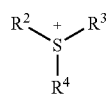

(2)

wherein $R^2$, $R^3$, and $R^4$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, or an unsubstituted monovalent heterocyclic organic group having 4 to 30 atoms, or a substituent having a ring wherein two or more of $R^2$, $R^3$, and $R^4$ in the formula (2) are bonded via the sulfur atom,

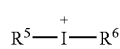

(3)

wherein $R^5$ and $R^6$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, or an unsubstituted monovalent heterocyclic organic group having 4 to 30 atoms, or a substituent having a ring wherein $R^5$ and $R^6$ in the formula (3) are bonded via the iodine atom.

[1-1] Resin

The resin included in the radiation-sensitive resin composition according to this embodiment includes a repeating unit shown by the general formula (1). Since the onium salt site of the repeating unit shown by the general formula (1) functions as an acid generator, the resin generates an acid (i.e., sulfonic acid) upon exposure to radiation or heat. Such a resin can be suitably used as a radiation-sensitive acid generator.

[1-1-1] Repeating Unit Shown by General Formula (1)

In the general formula (1), $R^1$ represents a hydrogen atom, a fluorine atom, or an alkyl group having 1 to 3 carbon atoms. Note that some or all of the hydrogen atoms of the alkyl group may be replaced by a fluorine atom. Examples of the alkyl group having 1 to 3 carbon atoms represented by $R^1$ include a methyl group, an ethyl group, a 1-propyl group, a 2-propyl group, a monofluoromethyl group, a difluoromethyl group, a trifluoromethyl group, and the like. $R^1$ preferably represents a hydrogen atom, a fluorine atom, a methyl group, or a trifluoromethyl group, with a methyl group being particularly preferable.

In the general formula (1), $M^+$ represents a sulfonium cation shown by the general formula (2) or an iodonium cation shown by the general formula (3). n represents an integer from 1 to 5, preferably an integer from 1 to 3, and more preferably 1 or 2.

Examples of the unsubstituted linear or branched alkyl group having 1 to 30 carbon atoms represented by $R^2$, $R^3$, and $R^4$ in the general formula (2) include a methyl group, an ethyl group, an n-propyl group, an i-propyl group, an n-butyl group, a 1-methylpropyl group, a 2-methylpropyl group, a t-butyl group, an n-pentyl group, an i-pentyl group, a 1,1-dimethylpropyl group, a 1-methylbutyl group, a 1,1-dimethylbutyl group, an n-hexyl group, an n-heptyl group, an i-hexyl group, an n-octyl group, an i-octyl group, a 2-ethylhexyl group, an n-nonyl group, an n-decyl group, an n-undecyl group, an n-dodecyl group, a cyclopropyl group, a cyclopentyl group, a cyclohexyl group, a 4-t-butylcyclohexyl group, and the like.

Examples of a substituent that may substitute the linear alkyl group having 1 to 30 carbon atoms include an aryl group having 6 to 30 carbon atoms, a linear or branched cyclic alkenyl group having 2 to 30 carbon atoms, a group having 1 to 30 atoms that contains a heteroatom such as a halogen atom, an oxygen atom, a nitrogen atom, a sulfur atom, a phosphorus atom, or a silicon atom, and the like. These substituents may be substituted by at least one arbitrary substituent, such as the above-mentioned substituents that may substitute the linear alkyl group.

Examples of the unsubstituted monovalent cyclic hydrocarbon group having 3 to 30 carbon atoms include a cyclohexenyl group, a group having a norbornene skeleton, a group having a norbornane skeleton, a group having an isobornyl skeleton, a group having a tricyclodecane skeleton, a group having a tetracyclododecane skeleton, a group having an adamantane skeleton, and the like.

Examples of a substituent that may substitute the monovalent cyclic hydrocarbon group having 3 to 30 carbon atoms include the substituents that may substitute the linear alkyl group having 1 to 30 carbon atoms.

Examples of the substituted monovalent cyclic hydrocarbon group having 3 to 30 carbon atoms include a benzyl group, a methoxymethyl group, a methylthiomethyl group, an ethoxymethyl group, an ethylthiomethyl group, a phenoxymethyl group, a methoxycarbonylmethyl group, an ethoxycarbonylmethyl group, an acetylmethyl group, a fluoromethyl group, a trifluoromethyl group, a chloromethyl group, a trichloromethyl group, a 2-fluoropropyl group, a (trifluoroacetyl)methyl group, a (trichloroacetyl)methyl group, a (pentafluorobenzoyl)methyl group, an aminomethyl group, a (cyclohexylamino)methyl group, a (diphenylphosphino)methyl group, a (trimethylsilyl)methyl group, a 2-phenylethyl group, a 3-phenylpropyl group, a 2-aminoethyl group, and the like.

Examples of the unsubstituted aryl group having 6 to 30 carbon atoms include a phenyl group, a 1-naphthyl group, a 2-naphthyl group, a 1-anthryl group, a 1-phenanthryl group, and the like.

Examples of a substituent that may substitute the aryl group having 6 to 30 carbon atoms include a linear, branched, or cyclic alkyl group having 1 to 30 carbon atoms, a group having 1 to 30 atoms that contains a heteroatom such as a halogen atom, an oxygen atom, a nitrogen atom, a sulfur atom, a phosphorus atom, or a silicon atom, and the like. These substituents may be substituted by at least one arbitrary substituent, such as the above-mentioned substituents that may substitute the aryl group having 6 to 30 carbon atoms.

Specific examples of the substituted aryl group having 6 to 30 carbon atoms include an o-tolyl group, an m-tolyl group, a p-tolyl group, a p-hydroxyphenyl group, a p-methoxyphenyl group, a mesityl group, an o-cumenyl group, a 2,3-xylyl group, a 2,4-xylyl group, a 2,5-xylyl group, a 2,6-xylyl group, a 3,4-xylyl group, a 3,5-xylyl group, a p-fluorophenyl group, a p-trifluoromethylphenyl group, a p-chlorophenyl group, a p-bromophenyl group, a p-iodophenyl group, and the like.

Examples of the unsubstituted monovalent heterocyclic organic group having 4 to 30 atoms include a furyl group, a thienyl group, a pyranyl group, a pyrrolyl group, a thianthrenyl group, a pyrazolyl group, an iso-thiazolyl group, an iso-oxazolyl group, a pyrazinyl group, a pyrimydinyl group, a pyridazinyl group, a tetrahydropyranyl group, a tetrahydrofuranyl group, a tetrahydrothiopyranyl group, a tetrahydrothiofuranyl group, a 3-tetrahydrothiophene-1,1-dioxide group, and the like.

Examples of the group in which two or more of $R^2$, $R^3$, and $R^4$ in the general formula (2) bond to form a ring via the sulfur atom include sulfonium cations shown by formulas (2-47) to (2-63) described later.

Examples of the substituted or unsubstituted linear or branched alkyl group having 1 to 30 carbon atoms, the substituted or unsubstituted monovalent cyclic hydrocarbon group having 3 to 30 carbon atoms, the substituted or unsubstituted aryl group having 6 to 30 carbon atoms, and the unsubstituted monovalent heterocyclic organic group having 4 to 30 atoms represented by $R^5$ and $R^6$ in the general formula (3) include equivalent groups respectively mentioned for the substituted or unsubstituted linear or branched alkyl group having 1 to 30 carbon atoms, the substituted or unsubstituted monovalent cyclic hydrocarbon group having 3 to 30 carbon atoms, the substituted or unsubstituted aryl group having 6 to 30 carbon atoms, and the unsubstituted monovalent heterocyclic organic group having 4 to 30 atoms represented by $R^2$, $R^3$, and $R^4$ in the general formula (2).

Examples of the group in which $R^5$ and $R^6$ in the general formula (3) bond to form a ring via the iodine atom include iodonium cations shown by formulas (3-38) and (3-39) described later.

As the sulfonium cation shown by the general formula (2), sulfonium cations shown by the following formulas (2-1) to (2-64) and the like may be suitably used.

(2-1)
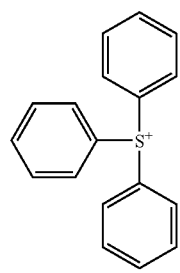
(2-2)
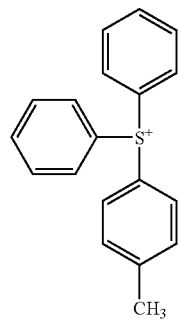
(2-3)
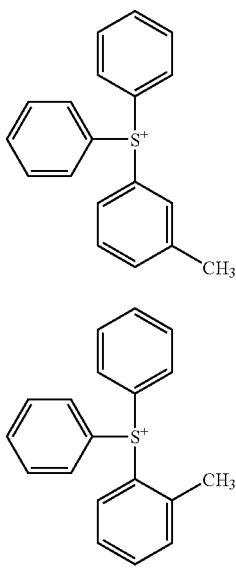
(2-4)
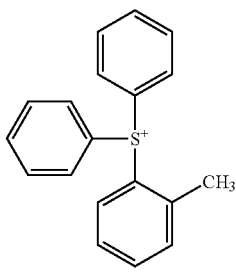
(2-5)
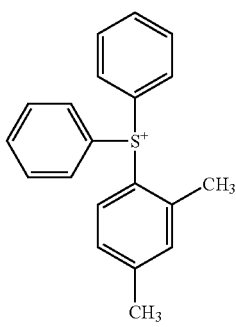
(2-6)
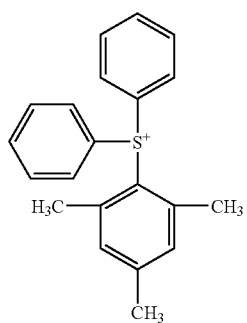
(2-7)
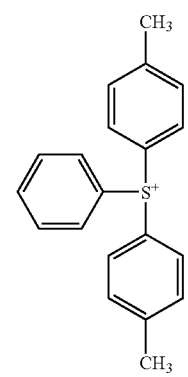
(2-8)
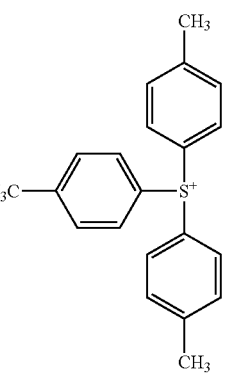
(2-9)
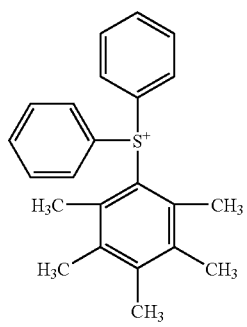

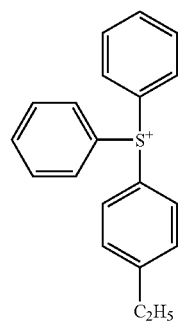
(2-10)
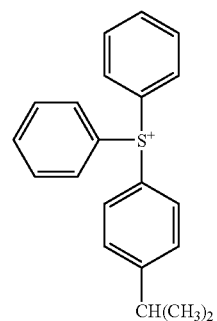
(2-11)
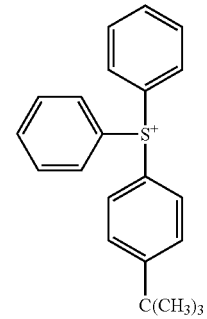
(2-12)
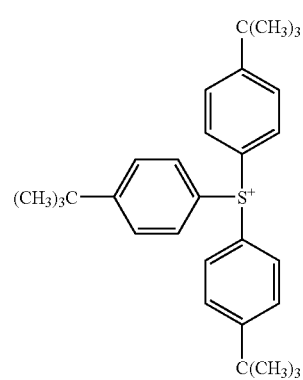
(2-13)
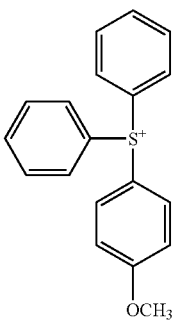
(2-14)
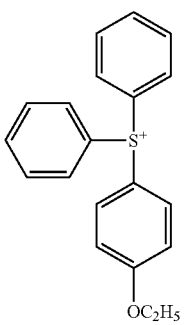
(2-15)
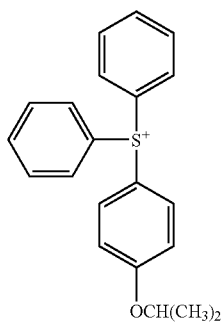
(2-16)
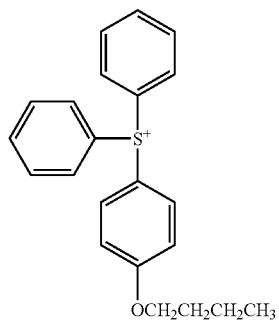
(2-17)
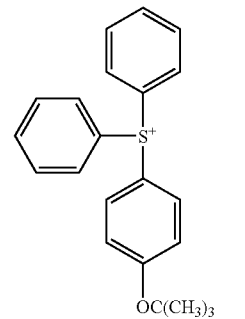
(2-18)

(2-19)
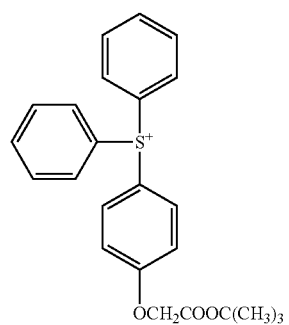
(2-20)
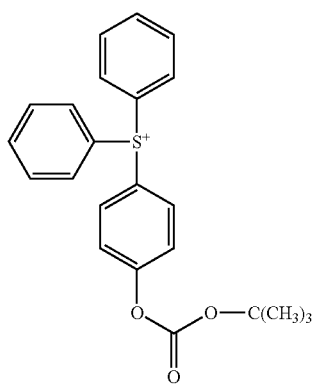
(2-21)
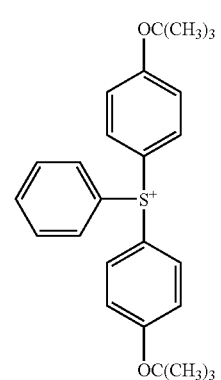
(2-22)
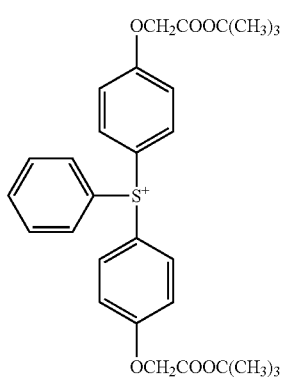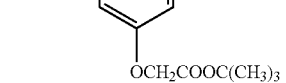
(2-23)
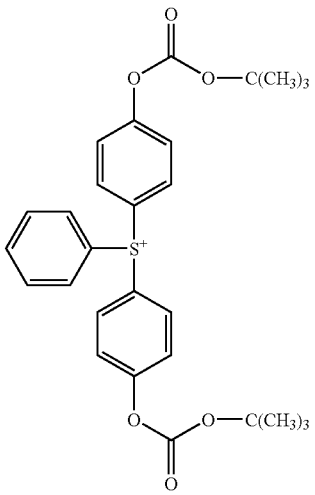
(2-24)
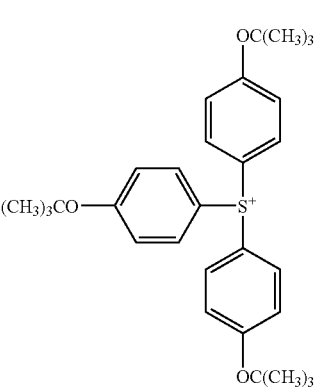
(2-25)
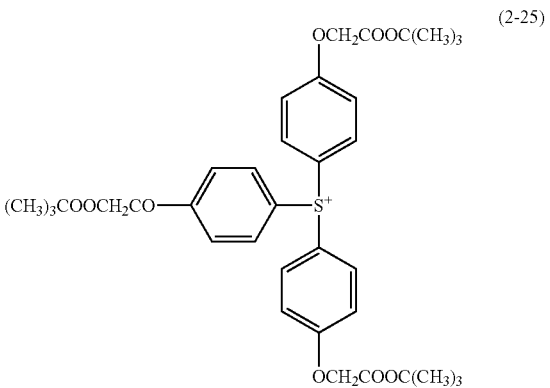

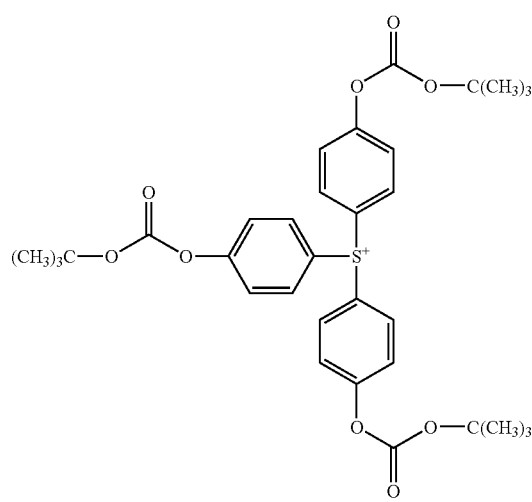
(2-26)
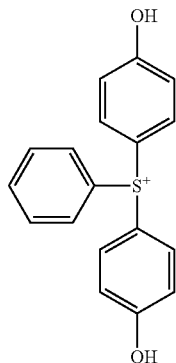
(2-30)
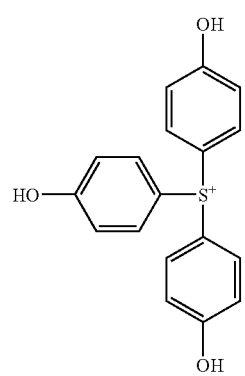
(2-31)
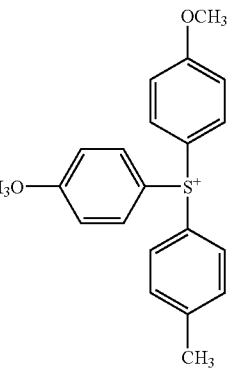
(2-27)
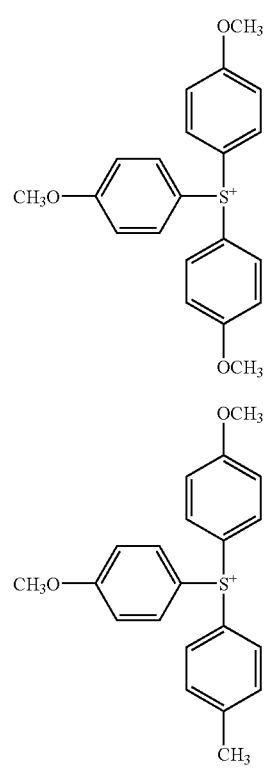
(2-28)
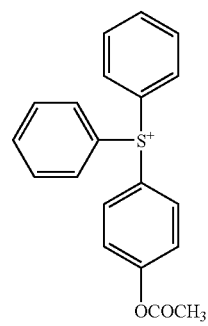
(2-32)
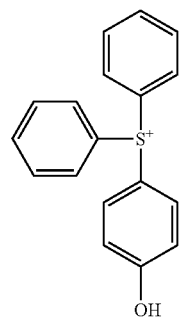
(2-29)
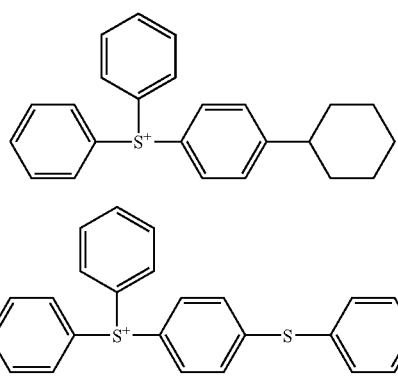
(2-33)
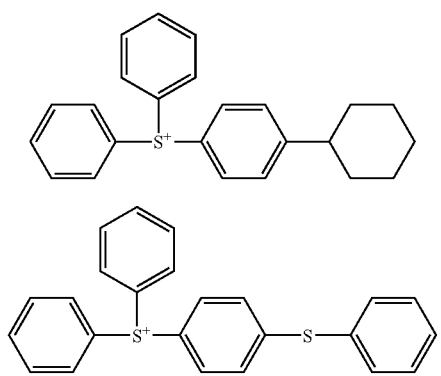
(2-34)

(2-35)
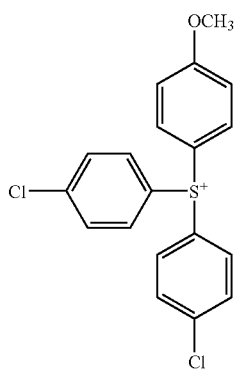
(2-36)
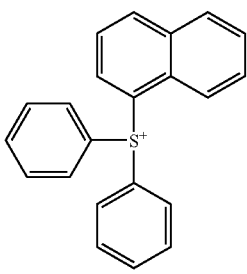
(2-37)
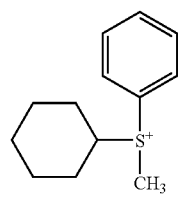
(2-38)
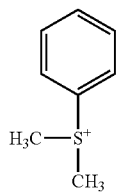
(2-39)
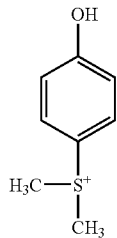
(2-40)
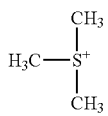
(2-41)
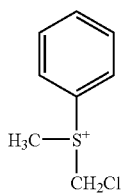
(2-42)
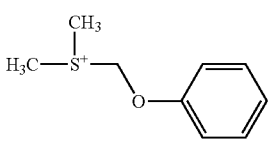
(2-43)
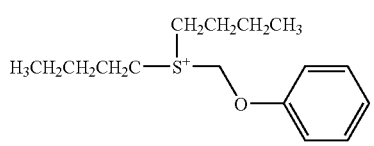
(2-44)
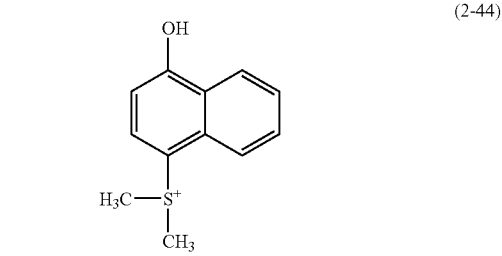
(2-45)
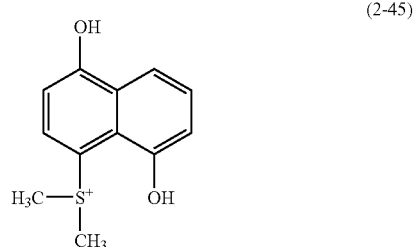
(2-46)
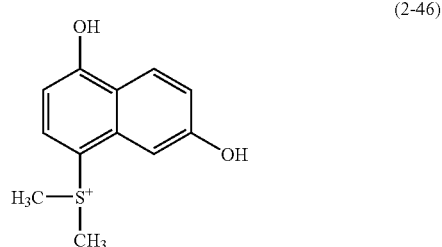
(2-47)
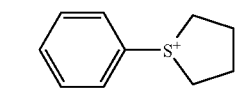
(2-48)
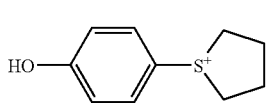
(2-49)
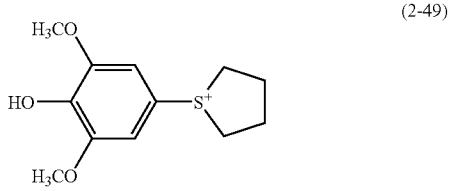
(2-50)
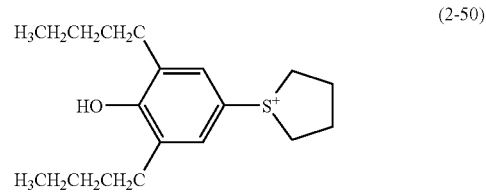

(2-51) 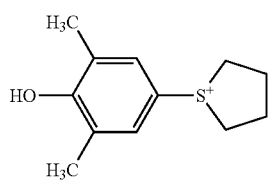
(2-52) 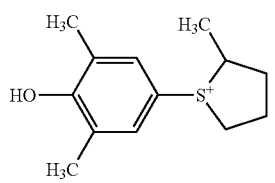
(2-53) 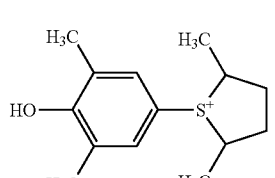
(2-54) 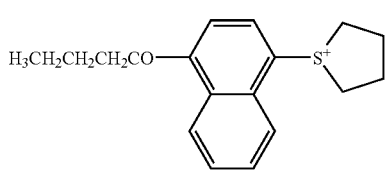
(2-55) 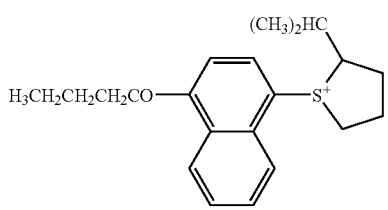
(2-56) 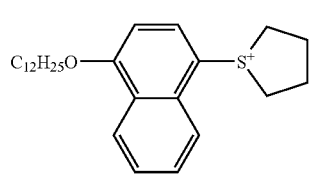
(2-57) 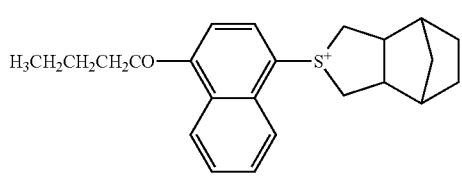
(2-58) 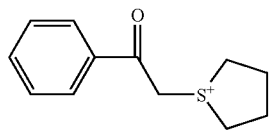
(2-59) 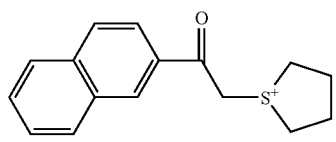
(2-60) 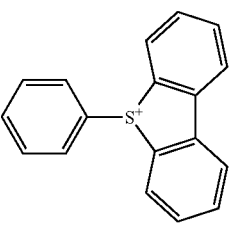
(2-61) 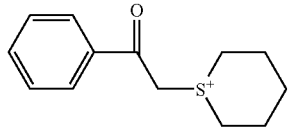
(2-62) 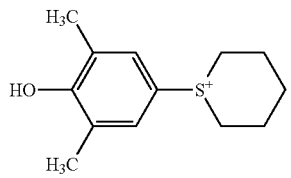
(2-63) 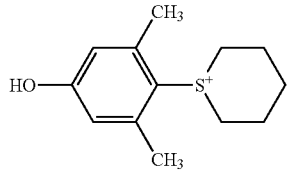
(2-64) 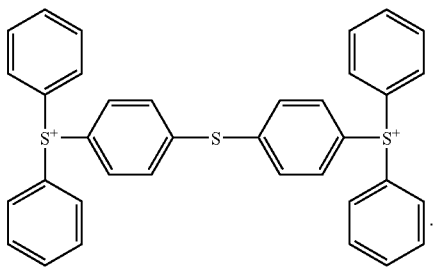
As the iodonium cation shown by the general formula (3), iodonium cations shown by the following formulas (3-1) to (3-39) and the like may be suitably used.
(3-1) 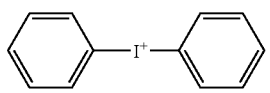
(3-2) 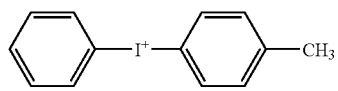
(3-3) 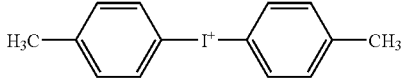
(3-4) 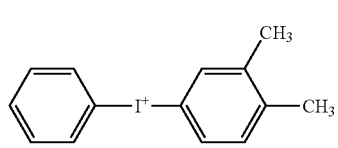

-continued are preferable. The sulfonium cation shown by the formula (2-1) (i.e., triphenylsulfonium cation) is particularly preferable.

The monovalent onium cation represented by M⁺ in the general formula (1) may be produced by a method described in Advances in Polymer Science, Vol. 62, pp. 1 to 48 (1984), for example.

The resin that is included in the radiation-sensitive resin composition according to this embodiment and includes the repeating unit shown by the general formula (1) functions as a radiation-sensitive component. Specifically, the monovalent onium cation dissociates upon exposure to radiation or heat so that the resin generates an acid. Specifically, the resin generates a sulfonic acid shown by the following general formula (1a).

(1a)

wherein $R^1$ represents a hydrogen atom, a fluorine atom, or an alkyl group having 1 to 3 carbon atoms, provided that some or all of the hydrogen atoms of the alkyl group may be replaced by a fluorine atom.

Since the resin included in the radiation-sensitive resin composition according to this embodiment has a strong fluorine-containing electron withdrawing group at the α-opposition of the sulfonyl group in its structure, the sulfonic acid shown by the general formula (1a) that is generated by exposure to radiation or heat has high acidity. The resin included in the radiation-sensitive resin composition according to this embodiment that functions as a radiation-sensitive acid generator hardly volatilizes during a lithographic process due to its high boiling point, and generates an acid that has a short diffusion length (i.e., an appropriate diffusion length) in a resist film. Moreover, since the fluorine atom content of the sulfonic acid shown by the general formula (1a) is lower than that of a higher perfluoroalkanesulfonic acid, the resin exhibits excellent combustibility, and is less accumulative in a human body.

The repeating unit shown by the general formula (1) that forms the resin included in the radiation-sensitive resin composition according to this embodiment is derived from a polymerizable onium sulfonate shown by the following general formula (5).

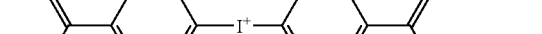
(5)

wherein $R^1$ represents a hydrogen atom, a fluorine atom, or an alkyl group having 1 to 3 carbon atoms, provided that some or all of the hydrogen atoms of the alkyl group may be replaced by a fluorine atom, M⁺ represents a sulfonium cation shown by the general formula (2) or an iodonium cation shown by the general formula (3), and n represents an integer from 1 to 5.

The polymerizable onium sulfonate shown by the general formula (5) is preferably a compound shown by the following formula (5-1). Specifically, the polymerizable onium sulfonate is preferably triphenylsulfonium-1,1,2,2-tetrafluoro-4-(2-methylacryloyloxy)-butane-1-sulfonate.

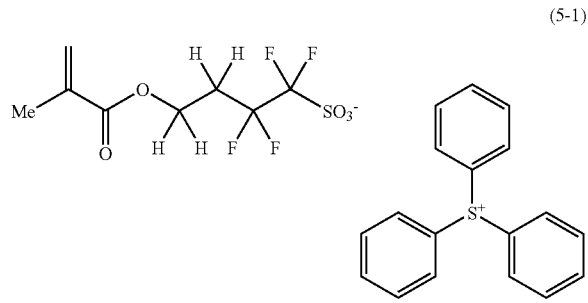

(5-1)

The polymerizable onium sulfonate shown by the general formula (5) may be produced by introducing a polymerizable site into an onium sulfonate compound. The onium sulfonate compound may be synthesized by a method described in Advances in Polymer Science, Vol. 62, pp. 1 to 48 (1984) or Inorganic Chemistry, Vol. 32, pp. 5007 to 5011 (1993), for example.

Specifically, the polymerizable onium sulfonate shown by the general formula (5) may be produced by first to fourth steps shown in the following reaction formula (a).

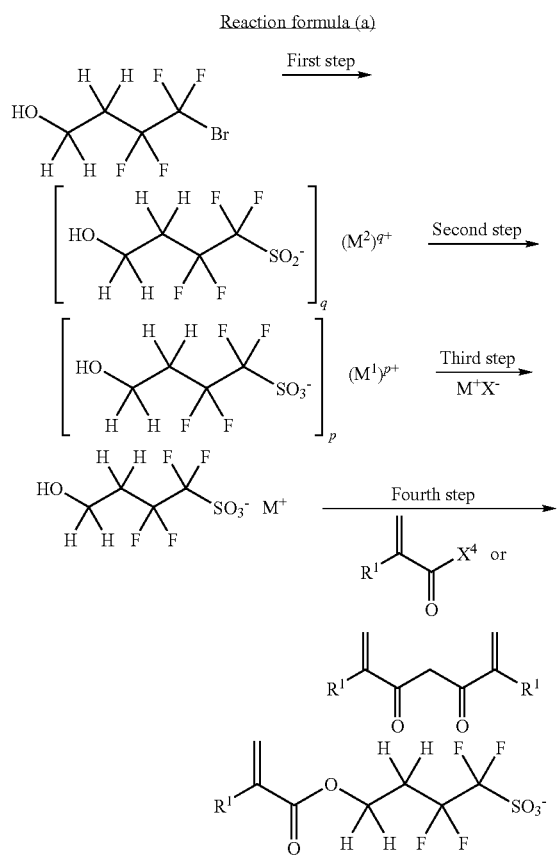

wherein $(M^2)^{q+}$ represents a counter cation that is a metal ion, q represents an arbitrary integer, $(M^1)^{p+}$ represents a counter cation that is a metal ion, p represents an arbitrary integer, $M^+$ represents a sulfonium cation or an iodonium cation, $X^-$ represents a monovalent anion, $R^1$ represents a hydrogen atom, a fluorine atom, or an alkyl group having 1 to 3 carbon atoms, and some or all of the hydrogen atoms of the alkyl group having 1 to 3 carbon atoms may be replaced by fluorine atoms, and $X^4$ represents a fluorine atom, a chlorine atom, a bromine atom, or an iodine atom.

Examples of the counter cation represented by $(M^1)^{p+}$ include lithium, sodium, potassium, calcium, and the like. p is preferably 1 or 2.

Examples of the counter cation represented by $(M^2)^{q+}$ include lithium, sodium, potassium, calcium, and the like. q is preferably 1 or 2.

In the first step, 4-bromo-3,3,4,4-tetrafluorobutan-1-ol is sulfinated using a sulfinating agent to obtain a corresponding metal sulfinate. In the second step, the metal sulfinate is oxidized using an oxidizer. In the third step, the oxidized metal sulfinate is reacted with a monovalent onium salt to obtain an onium sulfonate. In the fourth step, the onium sulfonate is reacted with an alkyl acrylic acid halide or an alkyl acrylic acid anhydride to obtain a polymerizable onium sulfonate.

[1-1-2] Other Repeating Units

The resin having the repeating unit shown by the general formula (1) may include a repeating unit other than the repeating unit shown by the general formula (1). As a repeating unit other than the repeating unit shown by the general formula (1), a repeating unit derived from a monomer shown by the following general formula (6) (hereinafter may be referred to as "repeating unit (6)") is preferable.

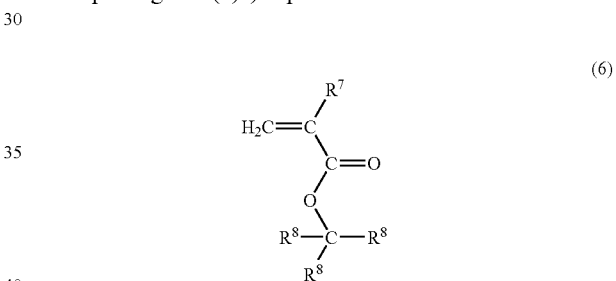

(6)

wherein $R^7$ represents a hydrogen atom, a methyl group, or a trifluoromethyl group, and $R^8$ individually represents a monovalent alicyclic hydrocarbon group having 4 to 20 carbon atoms or its derivative, a linear or branched alkyl group having 1 to 4 carbon atoms, provided that at least one of the three $R^8$s represents an alicyclic hydrocarbon group having 4 to 20 carbon atoms or its derivative; or two of the three $R^8$s may bond to form together with the carbon atom to which the two $R^8$s bond, and the remaining $R^8$ represents a linear or branched alkyl group having 1 to 4 carbon atoms or a monovalent alicyclic hydrocarbon group having 4 to 20 carbon atoms or its derivative.

Examples of the monovalent alicyclic hydrocarbon group having 4 to 20 carbon atoms include a group having an alicyclic ring derived from a cycloalkane such as norbornane, tricyclodecane, tetracyclododecane, adamantane, cyclobutane, cyclopentane, cyclohexane, cycloheptane, or cyclooctane, and the like. $R^8$ may represent a group obtained by substituting the above-mentioned group having an alicyclic ring by at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group. Among these alicyclic hydrocarbon groups, a group having an alicyclic ring derived from norbornane, tricyclodecane, tetracyclododecane, adamantane, cyclopentane, or cyclohexane, a group obtained by substituting the above-mentioned group having an alicyclic ring by the above-mentioned alkyl group, and the like are preferable.

Examples of the derivatives of the above-mentioned alicyclic hydrocarbon groups include the above-mentioned group having an alicyclic ring that is substituted by at least one substituent selected from a hydroxyl group; a carboxyl group; an oxo group (=O group); hydroxyalkyl groups having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, and a 4-hydroxybutyl group; alkoxyl groups having 1 to 4 carbon atoms such as a methoxy group, an ethoxy group, an n-propoxy group, an i-propoxy group, an n-butoxy group, a 2-methylpropoxy group, a 1-methylpropoxy group, and a t-butoxy group; a cyano group; cyanoalkyl groups having 2 to 5 carbon atoms such as a cyanomethyl group, a 2-cyanoethyl group, a 3-cyanopropyl group, and a 4-cyanobutyl group; and the like. Among these substituents, a hydroxyl group, a carboxyl group, a hydroxymethyl group, a cyano group, a cyanomethyl group, and the like are preferable.

Examples of the linear or branched alkyl group having 1 to 4 carbon atoms represented by $R^8$ include a methyl group, an ethyl group, an n-propyl group, an i-propyl group, an n-butyl group, a 2-methylpropyl group, a 1-methylpropyl group, a t-butyl group, and the like. Among these alkyl groups, a methyl group and an ethyl group are preferable.

Examples of the divalent alicyclic hydrocarbon group having 4 to 20 carbon atoms that is formed by two $R^8$s together with the carbon atom to which the two $R^8$s bond include alicyclic groups derived from a cycloalkane (e.g., norbornane, tricyclodecane, tetracyclododecane, adamantane, cyclobutane, cyclopentane, cyclohexane, cycloheptane, and cyclooctane) and the like.

The group —COOC($R^8$)$_3$ in the general formula (6) partially dissociates due to the action of an acid and forms a carboxyl group. Examples of the group —C($R^8$)$_3$ in the group —COOC($R^8$)$_3$ include groups shown by the following formulas (6a), (6b), (6c), and (6d) and the like.

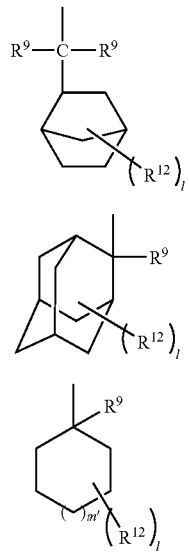

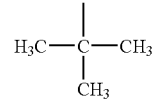

wherein $R^9$ individually represents a linear or branched alkyl group having 1 to 4 carbon atoms, $R^{11}$ represents a substituted or unsubstituted alkyl group having 1 to 4 carbon atoms, an alkoxy group, or a cyano group, provided that, when a plurality of $R^{12}$s are present, the plurality of $R^{12}$s may be the same or different, and two $R^{12}$s may bond to form a ring structure having 3 to 8 carbon atoms together with the carbon atom to which the two $R^{12}$s bond, l represents an integer from 0 to 4, and m' represents 0 or 1.

Examples of the linear or branched alkyl group having 1 to 4 carbon atoms represented by $R^9$ include a methyl group, an ethyl group, an n-propyl group, an i-propyl group, an n-butyl group, a 2-methylpropyl group, a 1-methylpropyl group, a t-butyl group, and the like. Among these alkyl groups, a methyl group and an ethyl group are preferable.

As the group shown by the formula (6a), a group in which two $R^9$s are methyl groups is preferable. As the group shown by the formula (6b), a group in which $R^9$ is a methyl group or an ethyl group is preferable. As the group shown by the formula (6c), a group in which m' is 0 and $R^9$ is a methyl group, a group in which m' is 0 and $R^9$ is an ethyl group, a group in which m' is 1 and $R^9$ is a methyl group, or a group in which m' is 1 and $R^9$ is an ethyl group is preferable.

Specific examples of the group shown by the formula (6a), the group shown by the formula (6b), and the group shown by the formula (6c) are as follows.

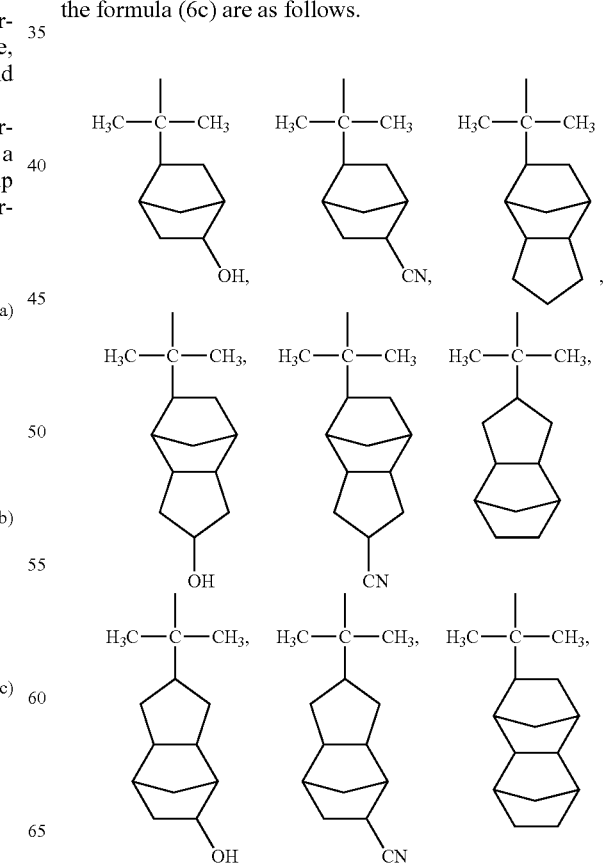

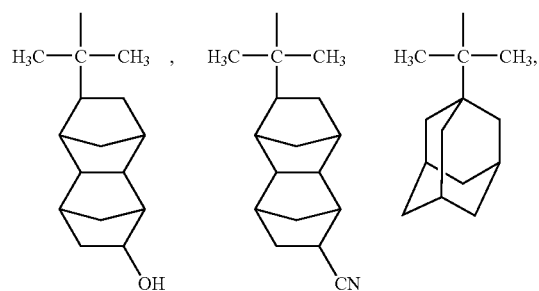
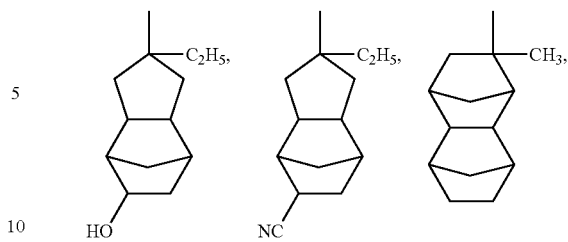
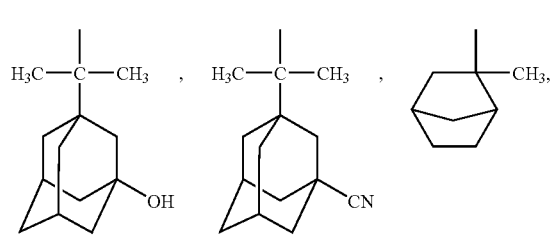
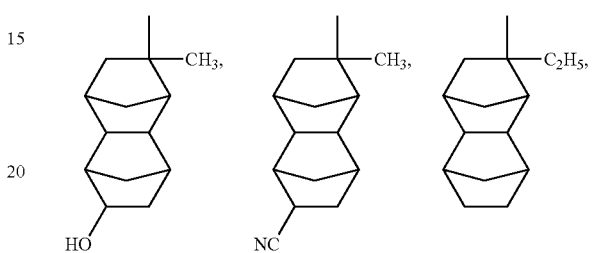
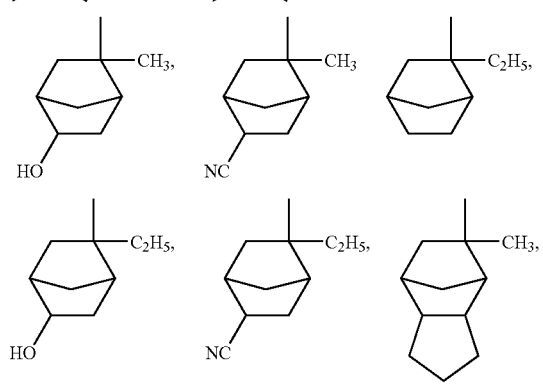
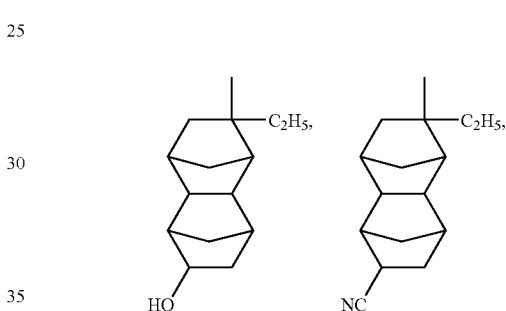
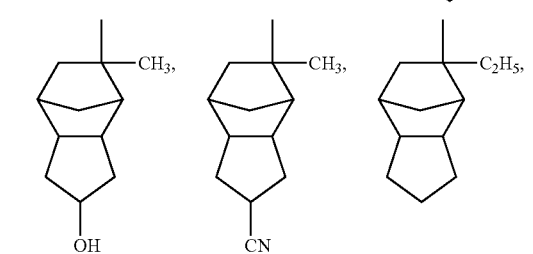
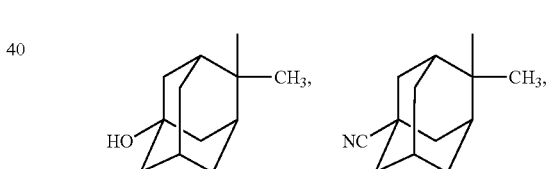
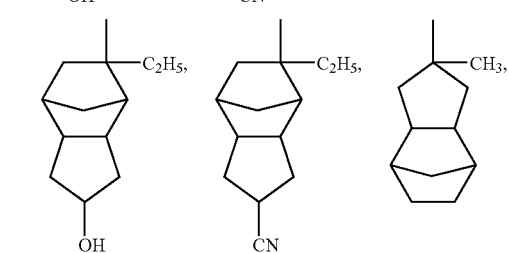
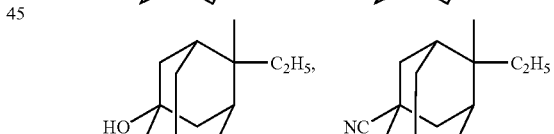
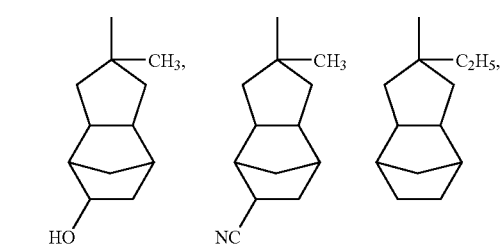
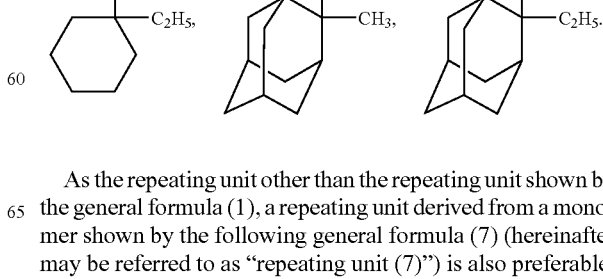
As the repeating unit other than the repeating unit shown by the general formula (1), a repeating unit derived from a monomer shown by the following general formula (7) (hereinafter may be referred to as "repeating unit (7)") is also preferable.

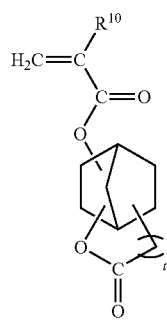

(7)

wherein $R^{10}$ represents a hydrogen atom, a methyl group, or a trifluoromethyl group, and t represents 0 or 1.

Furthermore, one may illustrate repeating units derived from the following monomers as examples of the other repeating units in addition to the other repeating units (6) and the other repeating units (7). Monofunctional compounds such as (meth)acrylates having a bridged hydrocarbon skeleton such as norbornyl (meth)acrylate, isonorbornyl (meth) acrylate, tricyclodecanyl (meth)acrylate, tetracyclodecanyl (meth)acrylate, dicyclopentenyl (meth)acrylate, adamantyl (meth)acrylate, and adamantylmethyl (meth)acrylate; carboxyl group-containing esters having a bridged hydrocarbon skeleton of an unsaturated carboxylic acid such as carboxynorbornyl (meth)acrylate, carboxytricyclodecanyl (meth) acrylate, and carboxytetracyclodecanyl (meth)acrylate;

(meth)acrylates that do not have a bridged hydrocarbon skeleton such as methyl (meth)acrylate, ethyl (meth)acrylate, n-propyl (meth)acrylate, n-butyl (meth)acrylate, 2-methylpropyl (meth)acrylate, 1-methylpropyl (meth)acrylate, t-butyl (meth)acrylate, 2-hydroxyethyl (meth)acrylate, 2-hydroxypropy (meth)acrylate, 3-hydroxypropyl (meth) acrylate, cyclopropyl (meth)acrylate, cyclopentyl (meth) acrylate, cyclohexyl (meth)acrylate, 4-methoxycyclohexyl (meth)acrylate, 2-cyclopentyloxycarbonylethyl (meth) acrylate, 2-cyclohexyloxycarbonylethyl (meth)acrylate, and 2-(4-methoxycyclohexyl)oxycarbonylethyl (meth) acrylate;

α-hydroxymethylacrylates; unsaturated nitryl compounds; unsaturated amide compounds; nitrogen-containing vinyl compounds; unsaturated carboxylic acids (anhydrides) such as (meth)acrylic acid, crotonic acid, maleic acid, maleic anhydride, fumaric acid, itaconic acid, anhydrous itaconic acid, citraconic acid, anhydrous citraconic acid, and mesaconic acid; carboxyl group-containing esters that do not have a bridged hydrocarbon skeleton of an unsaturated carboxylic acid such as 2-carboxyethyl (meth)acrylate, 2-carboxypropyl (meth)acrylate, 3-carboxypropyl (meth)acrylate, 4-carboxybutyl (meth)acrylate, and 4-carboxycyclohexyl (meth)acrylate; (meth)acryloyloxylactone compounds having an acid-dissociable group; and (meth)acryloyloxylactone compounds that do not have an acid-dissociable group;

polyfunctional compounds having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyl dimethylol di(meth) acrylate; and polyfunctional compounds that do not have a bridged hydrocarbon skeleton. Among these monomers, the (meth)acrylates having a bridged hydrocarbon skeleton are preferable.

When the resin included in the radiation-sensitive resin composition according to this embodiment includes the repeating unit shown by the general formula (1), the repeating unit (6), and the repeating unit (7), the content of the repeating unit shown by the general formula (1) is preferably 30 mol % or less, more preferably 1 to 30 mol %, and particularly preferably 1 to 15 mol %, based on all of the repeating units included in the resin. If the content of the repeating unit shown by the general formula (1) is more than 30 mol %, the radiation transmittance may decrease so that a rectangular resist pattern may not be obtained. If the content of the repeating unit shown by the general formula (1) is less than 1 mol %, the sensitivity and the resolution may decrease.

The content of the repeating unit (6) is preferably 10 to 80 mol %, more preferably 15 to 75 mol %, and particularly preferably 20 to 70 mol %, based on all of the repeating units included in the resin. If the content of the repeating unit (6) is less than 10 mol %, a resist film formed of the radiation-sensitive resin composition according to this embodiment may exhibit low solubility in an alkaline developer so that development defects may occur or the resolution may decrease. If the content of the repeating unit (6) is more than 80 mol %, the resolution may decrease.

The content of the repeating unit (7) is preferably 10 to 90 mol %, more preferably 20 to 80 mol %, and particularly preferably 30 to 70 mol %, based on all of the repeating units included in the resin. If the content of the repeating unit (7) is less than 10 mol %, the composition may exhibit insufficient adhesion to a substrate. If the content of the repeating unit (7) is more than 90 mol %, the resolution may decrease. Note that the total content of the repeating unit shown by the general formula (1), the repeating unit (6), and the repeating unit (7) is 100 mol %.

The resin included in the radiation-sensitive resin composition according to this embodiment may be produced by polymerizing the monomer that forms the repeating unit shown by the general formula (1) optionally together with a monomer that forms a repeating unit other than the repeating unit shown by the general formula (1) (e.g., the repeating units shown by the formula (6) and the repeating unit shown by the formula (7)) in an appropriate solvent using a radical polymerization initiator such as hydroperoxides, dialkyl peroxides, diacyl peroxides, or azo compounds optionally in the presence of a chain transfer agent.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylenes dibromides, and chlorobenzenes; saturated carboxylates such as ethyl acetate, n-butyl acetate, i-butyl acetate, and methyl propionate; ketones such as 2-butanone, 4-methyl-2-pentanone, and 2-heptanone; and ethers such as tetrahydrofuran, dimethoxyethane, and diethoxyethane. These solvents may be used either individually or in combination. The polymerization reaction temperature is preferably 40 to 120° C., and more preferably 50 to 90° C. The reaction time is preferably 1 to 48 hours, and more preferably 1 to 24 hours.

The weight average molecular weight (Mw) of the resin included in the radiation-sensitive resin composition according to this embodiment measured by gel permeation chromatography is preferably 1000 to 100,000, more preferably 1500 to 80,000, and particularly preferably 2000 to 50,000. If the Mw of the resin is less than 1000, the heat resistance of the resist may decrease. If the Mw of the resin is more than 100,000, the resolution of the resist may decrease. The ratio (Mw/Mn) of the weight average molecular weight (Mw) to the number average molecular weight (Mn) of the resin is preferably 1 to 5, and more preferably 1 to 3.

It is preferable that the polymer solution obtained by polymerization contain less impurity, such as halogens and metals. If the polymer solution contains less impurity, the resist exhibits an improved sensitivity, resolution, process stability, pattern shape, and the like. The resin may be purified by a chemical purification method (e.g., washing with water or liquid-liquid extraction) or a combination of the chemical purification method and a physical purification method (e.g., ultrafiltration or centrifugation), for example. In the present invention, the above-described resin may be used either individually or in combination.

[1-2] Solvent

Examples of the solvent included in the radiation-sensitive resin composition according to this embodiment include ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol methyl ether acetate, propylene glycol monoethyl ether acetate, propylene glycol mono-n-propyl ether acetate, and propylene glycol mono-n-butyl ether acetate;

lactates such as methyl lactate, ethyl lactate, n-propyl lactate, and i-propyl lactate; formates such as n-amyl formate and i-amyl formate; acetates such as ethyl acetate, n-propyl acetate, i-propyl acetate, n-butyl acetate, i-butyl acetate, n-amyl acetate, i-amyl acetate, 3-methoxybutyl acetate, and 3-methyl-3-methoxybutyl acetate; propionates such as i-propyl propionate, n-butyl propionate, i-butyl propionate, and 3-methyl-3-methoxybutyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methyl-3-methoxybutyl butyrate, methyl acetoacetate, ethyl acetoacetate, methyl pyruvate, and ethyl pyruvate; aromatic hydrocarbons such as toluene and xylene;

ketones such as methyl ethyl ketone, 2-pentanone, 2-hexanone, 2-heptanone, 3-heptanone, 4-heptanone, and cyclohexanone; amides such as N-methylformamide, N-dimethylformamide, N-methylacetamide, N,N-dimethylacetamide, and N-methylpyrrolidone; lactones such as γ-butylolactone; and the like. These solvents may be used either individually or in combination.

[1-3] Radiation-sensitive Acid Generator

The radiation-sensitive resin composition according to this embodiment may include a radiation-sensitive acid generator that generates an acid (hereinafter may be referred to as "additional acid generator") in addition to the resin that includes the repeating unit shown by the general formula (1) and the solvent. Examples of the additional acid generator include onium salt compounds, sulfonic acid compounds, and the like.

Examples of the onium salt compounds include iodonium salts, sulfonium salts, phosphonium salts, diazonium salts, pyridinium salts, and the like.

Specific examples of the onium salt compounds include diphenyliodonium trifluoromethanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl) iodonium perfluoro-n-octanesulfonate, cyclohexyl-2-oxocyclohexyl-methylsulfonium trifluoromethanesulfonate, dicyclohexyl-2-oxocyclohexylsulfonium trifluoromethanesulfonate, 2-oxocyclohexyldimethylsulfonium trifluoromethanesulfonate, bis(4-t-butylphenyl)iodonium nonafluorobutanesulfonate, bis(4-t-butylphenyl)iodonium trifluoromethanesulfonate, bis(4-t-butylphenyl)iodonium perfluorooctanesulfonate, bis(4-t-butylphenyl)iodonium p-toluenesulfonate, bis(4-t-butylphenyl)iodonium 10-camphorsulfonate, 4-trifluoromethyl benzenesulfonate, bis(4-t-butylphenyl)iodonium perfluorobenzenesulfonate, diphenyliodonium p-toluenesulfonate, diphenyliodonium benzenesulfonate, diphenyliodonium 10-camphorsulfonate, diphenyliodonium 4-trifluoromethylbenzenesulfonate, diphenyliodonium perfluorobenzenesulfonate, bis(p-fluorophenyl)iodonium trifluoromethanesulfonate, bis(p-fluorophenyl)iodonium nonafluoromethanesulfonate, bis(p-fluorophenyl)iodonium 10-camphorsulfonate, (p-fluorophenyl)(phenyl)iodonium trifluoromethanesulfonate, triphenylsulfonium nonafluorobutanesulfonate, triphenylsulfonium trifluoromethanesulfonate, triphenylsulfonium perfluorooctanesulfonate, triphenylsulfonium-2-bicyclo [2.2.1]hept-2-yl-1,1-difluoroethanesulfonate, triphenylsulfonium-2-bicyclo[2.2.1]hept-2-yl-1,1,2,2-tetrafluoroethanesulfonate, triphenylsulfonium p-toluenesulfonate, triphenylsulfonium benzenesulfonate, triphenylsulfonium 10-camphorsulfonate, triphenylsulfonium 4-trifluoromethylbenzenesulfonate, triphenylsulfonium perfluorobenzenesulfonate, 4-hydroxyphenyl-diphenylsulfonium trifluoromethanesulfonate, tris(p-methoxyphenyl)sulfonium nonafluorobutanesulfonate, tris(p-methoxyphenyl)sulfonium trifluoromethanesulfonate, tris(p-methoxyphenyl)sulfonium perfluorooctanesulfonate, tris(p-methoxyphenyl)sulfonium p-toluenesulfonate, tris(p-methoxyphenyl)sulfonium benzenesulfonate, tris(p-methoxyphenyl)sulfonium 10-camphorsulfonate, tris(p-fluorophenyl)sulfonium trifluoromethanesulfonate, tris(p-fluorophenyl)sulfonium p-toluenesulfonate, (p-fluorophenyl)diphenylsulfonium trifluoromethanesulfonate, 4-butoxy-1-naphthyltetrahydrothiophenium nonafluorobutanesulfonate, 4-butoxy-1-naphthyltetrahydrothiophenium-2-bicyclo[2.2.1]hept-2-yl-1,1,2,2-tetrafluoroethanesulfonate, and the like.

Examples of the sulfonic acid compounds include alkyl sulfonates, alkyl sulfonic acid imides, haloalkyl sulfonates, aryl sulfonates, iminosulfonates, and the like.

Specific examples of the sulfonic acid compounds include benzointosylate, tris(trifluoromethanesulfonate) of pyrogallol, nitrobenzyl-9,10-diethoxyanthracene-2-sulfonate, trifluoromethanesulfonylbicyclo[2,2,1]hept-5-en-2,3-dicarbodimide, nonafluoro-n-butanesulfonylbicyclo[2,2,1]hept-5-en-2,3-dicarbodimide, perfluoro-n-octanesulfonylbicyclo[2,2,1]hept-5-en-2,3-dicarbodimide, N-hydroxysuccinimide trifluoromethanesulfonate, N-hydroxysuccinimide nonafluoro-n-butanesulfonate, N-hydroxysuccinimide perfluoro-n-octanesulfonate, 1,8-napthalenedicarboxylic acid imide trifluoromethanesulfonate, 1,8-napthalenedicarboxylic acid imide nonafluoro-n-butanesulfonate, 1,8-napthalenedicarboxylic acid imide perfluoro-n-octanesulfonate, and the like.

Among these additional acid generators, diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl-2-oxocyclohexyl-methylsulfonium trifluoromethanesulfonate, dicyclohexyl-2-oxocyclohexylsulfonium trifluoromethanesulfonate, 2-oxocyclohexyldimethylsulfonium trifluoromethanesulfonate, trifluoromethanesulfonylbicyclo[2,2,1]hept-5-en-2,3-dicarbodiimide, nonafluoro-n-butanesulfonylbicyclo[2,2,1]hept-5-en-2,3-dicarbodiimide, perfluoro-n-octanesulfonylbicyclo[2,2,1]hept-5-en-2,3-dicarbodiimide, N-hydroxysuccinimide trifluoromethanesulfonate, N-hydroxysuccinimide nonafluoro-n-butanesulfonate, N-hydroxysuccinimide perfluoro-n-octanesulfonate, 1,8-napthalenedicarboxylic acid imide trifluoromethanesulfonate, triphenylsulfonium nonafluorobutanesulfonate, triphenylsulfonium trifluoromethanesulfonate, triphenylsulfonium-2-bicyclo[2.2.1]hept-2-yl-1,1-difluoroethanesulfonate, triphenylsulfonium-2-bicyclo[2.2.1]hept-2-yl-1,1,2,2-tetrafluoroethanesulfonate, 4-butoxynaphthyltetrahydrothiophenium nonafluorobutanesulfonate, 4-butoxy-1-naphthyltetrahydrothiophenium-2-bicyclo[2.2.1]hept-2-yl-1,1,2,2-tetrafluoroethanesulfonate, and the like are preferable. These additional acid generators may be used either individually or in combination.

When the radiation-sensitive resin composition according to this embodiment includes the additional acid generator, the additional acid generator is preferably used in an amount of 0.5 to 30 parts by mass, and more preferably 1 to 25 parts by mass, based on 100 parts by mass of the resin that includes the repeating unit shown by the general formula (1) from the viewpoint of ensuring the sensitivity and the developability of the resist film formed of the radiation-sensitive resin composition according to this embodiment. If the amount of the additional acid generator is less than 0.5 parts by mass, the resolution of the resist film may decrease. If the amount of the additional acid generator is more than 30 parts by mass, the radiation transmittance of the composition may decrease so that a rectangular resist pattern may not be obtained. The additional acid generator is preferably used in an amount of 70 parts by mass or less, more preferably 0 to 50 parts by mass, and particularly preferably 0 to 30 parts by mass, based on 100 parts by mass of the repeating unit shown by the general formula (1).

[1-4] Additive

The radiation-sensitive resin composition according to this embodiment may optionally include various additives such as an acid diffusion controller, an alicyclic additive having an acid-dissociable group, a surfactant, a photosensitizer, an alkali-soluble resin, a low-molecular-weight alkali-solubility controlling agent having an acid-dissociable protecting group, a halation inhibitor, a storage stability improver, and an anti-foaming agent.

The acid diffusion controller controls a phenomenon in which an acid generated by the acid generator upon exposure is diffused in the resist film to hinder undesired chemical reactions in the unexposed area. The storage stability of the radiation-sensitive resin composition is improved by adding the acid diffusion controller to the radiation-sensitive resin composition. Moreover, the addition of the acid diffusion controller further improves the resolution of the resist, and suppresses a change in line width of the resist pattern due to a variation in post-exposure delay (PED) from exposure to post-exposure heat treatment so that a composition that exhibits excellent process stability can be obtained.

As the acid diffusion controller, a nitrogen-containing organic compound of which the basicity does not change due to exposure or a heat treatment during formation of a resist pattern is preferable, for example. Examples of the nitrogen-containing organic compound include a compound shown by the following general formula (8) (hereinafter may be referred to as "nitrogen-containing compound (i)"), a compound having two nitrogen atoms in the molecule (hereinafter may be referred to as "nitrogen-containing compound (ii)"), a polyamino compound or a polymer having three or more nitrogen atoms (hereinafter may be referred to as "nitrogen-containing compound (iii)"), an amide group-containing compound, a nitrogen-containing heterocyclic compound, and the like.

wherein $R^{11}$ individually represents a hydrogen atom, a substituted or unsubstituted linear, branched, or cyclic alkyl group, a substituted or unsubstituted aryl group, or a substituted or unsubstituted aralkyl group.

Examples of the substituted or unsubstituted linear, branched, or cyclic alkyl group represented by $R^{11}$ in the general formula (8) include a methyl group, an ethyl group, a propyl group, a butyl group, an octyl group, a decyl group, a pentyl group, a cyclohexyl group, an adamantyl group, a norbornyl group, and the like. Among these, a butyl group, an octyl group, a cyclohexyl group, and the like are preferable.

Examples of the substituted or unsubstituted aryl group represented by $R^{11}$ in the general formula (8) include a phenyl group, a tolyl group, a naphthyl group, and the like. Among these, a phenyl group and the like are preferable.

Examples of the substituted or unsubstituted aralkyl group represented by $R^{11}$ in the general formula (8) include a benzyl group, a 2-phenylethyl group, and the like. Among these, a benzyl group and the like are preferable.

Examples of the nitrogen-containing compound (i) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; aromatic amines such as aniline, 2,6-diisopropylaniline, N-methylaniline, N,N-dimethylaniline, 2-methylaniline, 3-methylaniline, 4-methylaniline, 4-nitroaniline, diphenylamine, triphenylamine, and naphthylamine; and alicyclic amines such as N-t-butoxycarbonyl-4-hydroxypiperidine, 3-piperidino-1,2-propanediol, and the like.

Examples of the nitrogen-containing compounds (ii) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis (4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, and the like. Examples of the nitrogen-containing compounds (iii) include polyethylenimine, polyallylamine, a polymer of 2-dimethylaminoethylacrylamide, and the like.

Examples of the amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; and additionally include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the nitrogen-containing heterocyclic compound include imidazole, benzimidazole, 2-phenylbenzimidazole, pyrrole, piperidine, pyrimidine, and the like.

Among these nitrogen-containing organic compounds, the nitrogen-containing compound (i), the amide group-containing compound, the nitrogen-containing heterocyclic compound, and the like are preferable. The acid diffusion controller may be used either individually or in combination.

The alicyclic additive having an acid-dissociable group is a component for improving the dry etching resistance, the pattern shape, the adhesion to a substrate, and the like. Examples of the alicyclic additive include adamantane derivatives such as t-butyl 1-adamantanecarboxylate, t-butoxycarbonylmethyl 1-adamantanecarboxylate, di-t-butyl 1,3-adamantanedicarboxylate, t-butyl 1-adamantaneacetate, t-butoxycarbonylmethyl 1-adamantaneacetate, and di-t-butyl 1,3-adamantanediacetate; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like. These alicyclic additives may be used either individually or in combination.

The surfactant is a component for improving the applicability, striation, developability, and the like. Examples of the surfactant include nonionic surfactants such as polyoxyethylene lauryl ether, polyoxyethylene stearyl ether, polyoxyethylene oleyl ether, polyoxyethylene-n-octyl phenyl ether, polyoxyethylene-n-nonyl phenyl ether, polyethylene glycol dilaurate, and polyethylene glycol distearate. Examples of commercially available products of the surfactant include KP341 (manufactured by Shin-Etsu Chemical Co., Ltd.), Polyflow No. 75, and No. 95 (manufactured by Kyoeisha Chemical Co., Ltd.), FTOP EF301, EF303, and EF352 (manufactured by Tohkem Products Corporation), Megafac F171, and F173 (manufactured by DIC Corporation), Fluorad FC430, and FC431 (manufactured by Sumitomo 3M Ltd.), Asahi GuardAG710, Surflon S-382, SC-101, SC-102, SC-103, SC-104, SC-105, and SC-106 (manufactured by Asahi Glass Co., Ltd.), and the like. These surfactants may be used either individually or in combination.

[2] Use of Radiation-sensitive Resin Composition

The radiation-sensitive resin composition according to this embodiment is useful as a chemically-amplified resist. Specifically, when a resist film is formed using the radiation-sensitive resin composition according to this embodiment, the acid-dissociable group contained in the resin that includes the repeating unit shown by the general formula (1) dissociates due to the action of an acid generated by the acid-generating component of the resin (the acid-generating component of the resin and an additional acid generator when the additional acid generator is added); said resin having the repeating unit shown by the general formula (1), upon exposure to radiation and produces a carboxyl group. As a result, since the exposed area of the resist exhibits increased solubility in an alkaline developer, the exposed area of the resist is dissolved and removed by an alkaline developer to obtain a positive-tone resist pattern.

A resist film is formed as follows using the radiation-sensitive resin composition according to this embodiment. Specifically, the resin is uniformly dissolved in the solvent optionally together with the additional acid generator to prepare a preliminary composition. The preliminary composition is filtered through a filter having a pore diameter of about 200 nm to obtain a composition solution. The solvent is preferably used in such an amount that the total solid content is 0.1 to 50 mass %, and more preferably 1 to 40 mass %. This ensures a smooth filtering operation.

The composition solution is applied to a substrate (e.g., a silicon wafer or a wafer coated with aluminum) using an appropriate application method (e.g., rotational coating, cast coating, or roll coating) to form a resist film. After subjecting the resist film to an optional prebake (hereinafter referred to as "PB"), the resist film is exposed to radiation so that a given resist pattern is formed. As radiation, visible radiation, ultraviolet radiation, deep ultraviolet radiation, X-rays, charged particle rays, or the like is appropriately used. Among these, it is preferable to use deep ultraviolet radiation emitted from an ArF excimer laser (wavelength: 193 nm) or a KrF excimer laser (wavelength: 248 nm). It is particularly preferable to use deep ultraviolet radiation emitted from an ArF excimer laser (wavelength: 193 nm). It is preferable to perform a post-exposure bake (PEB) after exposure. The PEB ensures that the dissociation reaction of the acid-dissociable group contained in the resin progresses smoothly. The PEB temperature varies depending on the composition of the radiation-sensitive resin composition, but is preferably 30 to 200° C., and more preferably 50 to 170° C.

In order to bring out the potential of the radiation-sensitive resin composition according to this embodiment to a maximum extent, an organic or inorganic anti-reflective film may be formed on the substrate as disclosed in JP-B-6-12452, for example. A protective film may be formed on the resist film as disclosed in JP-A-5-188598 and the like in order to prevent a situation in which the resist film is adversely affected by basic impurities and the like contained in the atmosphere. Note that these technologies may be used in combination.

The resist film that has been exposed to radiation is developed to form a given resist pattern. As the developer, it is preferable to use an alkaline aqueous solution in which at least one alkaline compound selected from sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like is dissolved. The concentration of the alkaline aqueous solution is preferably 10 mass % or less. If the concentration of the alkaline aqueous solution is more than 10 mass %, the unexposed area may be dissolved in the developer.

An organic solvent may be added to the developer, for example. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methyl alcohol, ethyl alcohol, n-propyl alcohol, i-propyl alcohol, n-butyl alcohol, tert-butyl alcohol, cyclopentyl alcohol, cyclohexanol, 1,4-hexanediol, 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide, and the like.

These organic solvents may be used either individually or in combination. The organic solvent is preferably used in an amount of 100 vol % or less based on the alkaline aqueous solution. If the amount of the organic solvent is more than 100 vol %, the developability may decrease so that the exposed area may remain undeveloped. An appropriate amount of surfactant or the like may also be added to the developer. The resist film that has been developed using the developer is preferably washed with water and then dried.

EXAMPLES

The present invention is further described below by way of examples. Note that the present invention is not limited to the following examples. In the examples, "part" and "%" respectively refer to "part by mass" and "mass %" unless otherwise indicated.

The molecular weight (Mw and Mn) and the molecular weight distribution (Mw/Mn) of the resin obtained in the synthesis example were measured as follows.
[Molecular Weight (Mw and Mn) Measurement Method]

The molecular weight (Mw and Mn) of the resin was measured by gel permeation chromatography (GPC) using GPC columns (TSKgel α-2500 and TSKgel α-M manufactured by Tosoh Corp.) at a flow rate of 1.0 ml/min and a column temperature of 40° C. using, as an elute, dimethylformamide in which 30 mmol/l LiBr and 10 mmol/l of $H_3PO_4$ were dissolved. A detector MALLS (manufactured by Wyatt, DAWN DSP, cell type K5, laser wavelength: 632.8 nm) was used to measure the molecular weight.

The sensitivity, the resolution, the DOF, and the LER of the radiation-sensitive resin composition obtained in each example and comparative example were evaluated as follows.
[Sensitivity]

The composition was spin-coated onto a substrate (wafer) on which an ARC29A film (manufactured by Nissan Chemical Industries, Ltd., thickness: 77 nm) was formed. The composition was pre-baked (PB) on a hot plate at 100° C. for 90 seconds to form a resist film having a thickness of 200 nm. The resist film was then exposed through a mask pattern using a full-field reduction projection aligner ("S306C" manufactured by Nikon Corp., numerical aperture: 0.75). After subjecting the resist film to PEB at 110° C. for 90 seconds, the resist film was developed using a 2.38 mass % TMAH aqueous solution at 25° C. for 60 seconds, washed with water, and dried to obtain a positive-tone resist pattern. A dose ($J/m^2$) when a 1:1 line-and-space pattern having a line width of 100 nm was formed through a 1:1 line-and-space mask having a line width of 100 nm was determined to be an optimum dose ($J/m^2$). The optimum dose was evaluated as the sensitivity.
[Resolution]

The minimum dimensions (μm) of the resist pattern resolved at the optimum dose were evaluated as the resolution.
[LER]

A 1:1 line-and-space pattern (line width: 100 nm) developed at the optimum dose was observed from above using an instrument "SEM S9220" (manufactured by Hitachi, Ltd.) at arbitrary points. A variation in line width was evaluated by the three-sigma method. A lower LER indicates better roughness.
[DOF]

A line-and-space pattern (1L1S) (line width: 100 nm) was exposed at the optimum dose while changing the depth of focus from −1.0 μm to +1.0 μm at intervals of 0.05 μm. A range (μm) in which the line width was 90 nm (−10%) to 110 nm (+10%) was evaluated as the DOF. A larger DOF indicates better depth of focus tolerance.

Synthesis Example 1

A 2 l reactor was charged with 151 g (0.67 mol) of 4-bromo-3,3,4,4-tetrafluorobutan-1-ol, 600 ml of acetonitrile, 600 ml of water, 112 g (1.33 mol/2.0 eq)) of sodium hydrogencarbonate, and 235 g (1.35 mol/2.0 eq) of sodium dithionite in a nitrogen stream. The mixture was stirred at room temperature for 12 hours. The reaction solution was extracted four times with 500 ml of acetonitrile. The solvent was evaporated from the resulting organic layer to obtain a compound (i).

A reactor was charged with 120 g (0.52 mol) of the compound (i), 650 ml of water, 74 g (0.65 mol/1.26 eq)) of a 30% hydrogen peroxide solution, and 0.171 g (0.00058 mol/0.0011 eq) of disodium tungstate. The mixture was stirred at room temperature for one hour. The reaction solution was heated under reduced pressure to evaporate volatile components, and then dried to obtain a compound (ii).

121 g of the compound (ii) (purity: 78%, 0.38 mol) was suspended in 560 g of dichloromethane. A triphenylsulfonium chloride aqueous solution (triphenylsulfonium chloride: 115 g (0.385 mol/1.01 eq)), water: 450 g) was added dropwise to the suspension at room temperature. The reaction solution separated into two layers was vigorously stirred at room temperature for 90 minutes. The organic layer was separated and washed four times with 250 ml of water. After evaporating volatile components from the organic layer, the organic layer was dried to obtain a compound (iii).

A reactor was charged with 451 g (0.92 mol) of the compound (iii), 1.92 kg of chloroform, 177 g (1.15 mol/1.24 eq) of methacrylic anhydride, 53.7 g (0.00056 mol/0.00061 eq) of methanesulfonic acid, and 0.65 g of "Nonflex MBP" (2,2'-methylenebis(4-methyl-6-tert-butylphenol manufactured by Seiko Chemical Co, Ltd.). The mixture was stirred at 45° C. for six hours. After cooling the reaction solution, the reaction solution was washed seven times with 1.5 kg of water, and heated under reduced pressure to evaporate volatile components from the organic layer. The resulting liquid was washed three times with 250 g of diisopropyl ether, and then dried to obtain a compound (M-3) shown by the following formula (M-3).

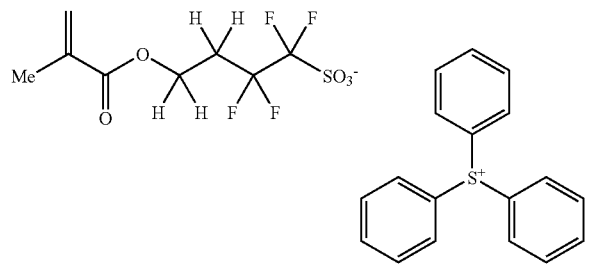

(M-3)

Synthesis Example 2

10.98 g (52 mol %) of a compound (M-1) shown by the following formula (M-1), 7.96 g (46 mol %) of a compound (M-2) shown by the following formula (M-2), and 1.06 g (2 mol %) of the compound (M-3) were dissolved in 60 g of 2-butanone. A monomer solution to which 0.78 g of AIBN was added was prepared. A 100 ml three-necked flask charged with 20 g of 2-butanone was purged with nitrogen for 30 minutes. After purging with nitrogen, the reaction vessel was heated to 80° C. with stirring. The monomer solution prepared in advance was added dropwise to the reaction vessel using a dropping funnel over three hours. A polymerization reaction was carried out for six hours from the start time of the dropwise addition of the monomer solution. After completion of polymerization, the polymer solution was cooled with water to 30° C. or less. The polymer solution was then added to 100 g of 2-propanol. A white powder that precipitated was collected by filtration.

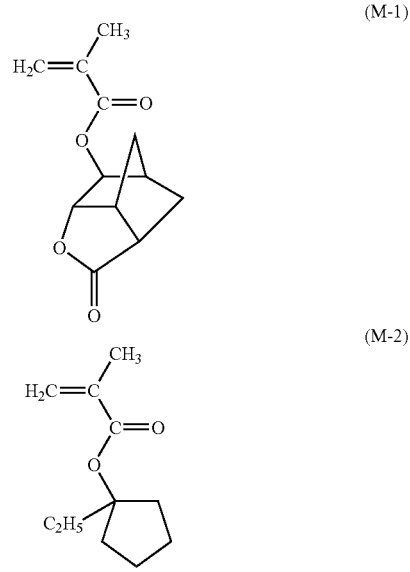

The collected white powder in the form of a slurry was washed twice with 500 g of 2-propanol. The powder was then collected by filtration, and dried at 50° C. for 17 hours to obtain a white powdery polymer (10 g, yield: 68%). The polymer was a copolymer having an Mw of 11,900 and a ratio Mw/Mn of 1.27. The ratio of the repeating unit derived from the compound (M-1), the repeating unit derived from the compound (M-2), and the repeating unit derived from the compound (1) determined by $^{13}$C-NMR analysis was 64.3:33.5:2.2 (mol %). The copolymer is referred to as a resin (A-1).

Synthesis Example 3

A resin (A-2) was obtained in the same manner as in Synthesis Example 2, except that the amounts of the monomers and the initiator were changed as shown in Table 1. The resin (A-2) was a copolymer having an Mw of 12,800 and a ratio Mw/Mn of 1.19. The ratio of the repeating unit derived from the compound (M-1), the repeating unit derived from the compound (M-2), and the repeating unit derived from the compound (M-3) was 60.9:35.0:4.1.

Synthesis Example 4

A resin (R-1) was prepared in the same manner as in Synthesis Example 2, except that the amounts of the monomers and the initiator were changed as shown in Table 1. The resin (R-1) was a copolymer having an Mw of 11,600 and a ratio Mw/Mn of 1.21. The ratio of the repeating unit derived from the compound (M-1), the repeating unit derived from the compound (M-2), and the repeating unit derived from the compound (1) was 60.5:39.5:0.

TABLE 1

| | Monomer | | | | | |
|---|---|---|---|---|---|---|
| | Type | Amount (mol %) | Type | Amount (mol %) | Type | Amount (mol %) |
| Synthesis Example 2 | M-1 | 52 | M-2 | 46 | Compound (1) | 2 |
| Synthesis Example 3 | M-1 | 50 | M-2 | 46 | Compound (1) | 4 |
| Synthesis Example 4 | M-1 | 50 | M-2 | 50 | — | — |

[Preparation of Radiation-sensitive Resin Composition Solution]

Example 1

50 parts of the resin (A-1), 50 parts of the resin (A-2), 1.10 part of N-t-butoxycarbonyl-4-hydroxypiperidine ((D-1) in Table 2) (acid diffusion controller), 1400 parts of propylene glycol monomethyl ether acetate ((C-1) in Table 2) (solvent), and 600 parts of cyclohexanone ((C-2) in Table 2) (solvent) were mixed to prepare a homogeneous solution. The solution was filtered through a membrane filter having a pore diameter of 200 nm to prepare a radiation-sensitive resin composition solution. The radiation-sensitive resin composition solution was evaluated as described above.

The radiation-sensitive resin composition solution of Example 1 had a sensitivity of 440 J/m$^2$, a resolution of 0.09 μm, a DOF of 0.8 μm, and a LER of 3.8 nm.

Example 2 and Comparative Example 1

A radiation-sensitive resin composition solution was prepared in the same manner as in Example 1, except that the types and amounts of components were changed as shown in Table 2. The radiation-sensitive resin composition solution was evaluated as described above. The evaluation results are shown in Table 3.

TABLE 2

| | Resin | | | | Additional acid generator | | Acid diffusion controller | | Solvent | | | |
|---|---|---|---|---|---|---|---|---|---|---|---|---|
| | Type | Amount (parts) | Type | Amount (parts) | Type | Amount (parts) | Type | Amount (parts) | Type | Amount (parts) | Type | Amount (parts) |
| Example 1 | A-1 | 50 | A-2 | 50 | — | — | D-1 | 1.10 | C-1 | 1400 | C-2 | 600 |
| Example 2 | A-1 | 50 | A-2 | 50 | B-1 | 1.0 | D-1 | 1.40 | C-1 | 1400 | C-2 | 600 |
| Comparative Example 1 | R-1 | 100 | — | — | B-1 | 4.0 | D-1 | 0.80 | C-1 | 1400 | C-2 | 600 |

TABLE 3

| | Sensitivity (J/m$^2$) | Resolution (μm) | DOF (μm) | LER (nm) |
|---|---|---|---|---|
| Example 1 | 440 | 0.09 | 0.8 | 3.8 |
| Example 2 | 450 | 0.09 | 0.7 | 3.7 |
| Comparative Example 1 | 460 | 0.10 | 0.6 | 6.5 |

In Table 2, "B-1" indicates triphenylsulfonium nonafluoro-n-butanesulfonate, "B-2" indicates triphenylsulfonium trifluoromethanesulfonate, and "D-2" indicates 3-piperidino(piperidino)-1,2-propanediol.

As clear from Table 3, the radiation-sensitive resin compositions of Examples 1 and 2 showed good evaluation results as compared with the radiation-sensitive resin composition of Comparative Example 1.

A chemically-amplified resist that is sensitive to activated rays such as deep ultraviolet radiation emitted from a KrF excimer laser (wavelength: 248 nm) or an ArF excimer laser (wavelength: 193 nm) can be advantageously formed using the radiation-sensitive resin composition according to the present invention. The chemically-amplified resist thus formed exhibits a high resolution, a wide DOF, and an excellent LER. Therefore, the chemically-amplified resist can be suitably used in the production of integrated circuit devices that are expected to be further miniaturized.

INDUSTRIAL APPLICABILITY

The radiation-sensitive resin composition according to the present invention can be suitably used as a positive-tone radiation-sensitive resin composition and a negative-tone radiation-sensitive resin composition useful as a chemically-amplified resist.

The invention claimed is:
1. A radiation-sensitive resin composition comprising a resin and a solvent, the resin including a repeating unit shown by the following general formula (1),

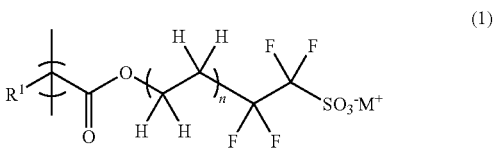

(1)

wherein R$^1$ represents a hydrogen atom, a fluorine atom, or an alkyl group having 1 to 3 carbon atoms, provided that some or all of the hydrogen atoms of the alkyl group may be replaced by a fluorine atom, M$^+$ represents a sulfonium cation shown by the following general formula (2) or an iodonium cation shown by the following general formula (3), and n represents an integer from 1 to 5,

(2)

wherein R$^2$, R$^3$, and R$^4$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, or an unsubstituted monovalent heterocyclic organic group having 4 to 30 atoms, or a substituent having a ring wherein two or more of R$^2$, R$^3$, and R$^4$ are bonded via the sulfur atom,

(3)

wherein R$^5$ and R$^6$ individually represent a substituted or unsubstituted linear or branched alkyl group having 1 to 30 carbon atoms, a substituted or unsubstituted monovalent cyclic hydrocarbon group having 3 to 30 carbon atoms, a substituted or unsubstituted aryl group having 6 to 30 carbon atoms, or an unsubstituted monovalent heterocyclic organic group having 4 to 30 atoms, or a substituent having a ring wherein R$^5$ and R$^6$ are bonded via the iodine atom.

* * * * *